US009159713B1

(12) United States Patent
Chen et al.

(10) Patent No.: US 9,159,713 B1
(45) Date of Patent: Oct. 13, 2015

(54) OPTO-ELECTRONIC CIRCUIT BOARD AND METHOD FOR ASSEMBLING THE SAME (71) Applicant: Unimicron Technology Corp., Taoyuan (TW)

(72) Inventors: Yin-Ju Chen, Taoyuan (TW); Cheng-Po Yu, Taoyuan (TW); Pei-Chang Huang, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 14/493,336

(22) Filed: Sep. 22, 2014

(30) Foreign Application Priority Data

Jun. 10, 2014 (TW) .............................. 103120048 A (51) Int. Cl.
*H01L 23/52* (2006.01)
*H01L 25/16* (2006.01)
*G02B 6/12* (2006.01)

(52) U.S. Cl.
CPC .......... *H01L 25/167* (2013.01); *G02B 6/12004* (2013.01)

(58) Field of Classification Search
CPC .......... H05K 1/0274; G02B 6/43; G02B 6/12; G02B 6/4249; G02B 6/4214; H01L 2224/48091; H01L 2924/00; H01L 2224/32245; H01L 2224/48247; H01L 2224/73265; H01L 2924/02; H01L 2924/12; H01L 2924/14; H01L 33/60; H01L 2924/01079; H01L 2924/01078

USPC .................. 257/E21.002, E21.599, E31.117, 257/E31.127, E33.072, 211, 98–100, 257/E25.032, E33.056; 438/106–127, 438/25–29, 31, 64–65, 51, 55; 385/14, 88, 385/49, 129, 32, 33, 92, 93
See application file for complete search history.

(56) References Cited

U.S. PATENT DOCUMENTS

| | | | |
|---|---|---|---|
| 2007/0121696 A1* | 5/2007 | Ishii ............................... | 372/99 |
| 2009/0028497 A1* | 1/2009 | Kodama et al. .................. | 385/14 |
| 2010/0019368 A1* | 1/2010 | Shin ............................. | 257/686 |

* cited by examiner

Primary Examiner — Thao X Le
Assistant Examiner — Nduka Ojeh
(74) Attorney, Agent, or Firm — CKC & Partners Co., Ltd.

(57) ABSTRACT

An opto-electronic circuit board includes a substrate, a cavity, blind vias, metal layers, a first chip, a second chip, and the optical component. The substrate includes a first circuit layer, a second circuit layer, and a dielectric layer disposed between the first circuit layer and the second circuit layer. The cavity is disposed on the dielectric layer, in which the cavity extends from the first circuit layer to the second circuit layer. The blind vias are disposed at opposite sides of the cavity. The first chip is disposed on the second circuit layer with corresponding to one of the blind vias. The second chip is disposed on the second circuit layer with corresponding to the other one of the blind vias. The optical component is disposed in the cavity, in which the second surface of the optical component is connected to the first circuit layer.

14 Claims, 11 Drawing Sheets

OPTO-ELECTRONIC CIRCUIT BOARD AND METHOD FOR ASSEMBLING THE SAME

RELATED APPLICATIONS

This application claims priority to Taiwan Application Serial Number 103120048, filed Jun. 10, 2014, which is herein incorporated by reference.

BACKGROUND

1. Field of Invention

The present invention relates to an opto-electronic circuit board and a method for assembling the same. More particularly, the present invention relates to an opto-electronic circuit board including an optical component and a method for assembling the same.

2. Description of Related Art

With a development of the data processing, the data transmission speed has gradually fallen behind the data calculation speed of a central processing unit (CPU). Therefore, an optical signal transmission has been implemented and a waveguide configured for guiding the optical signal is introduced into an opto-electronic circuit board.

In the conventional opto-electronic circuit board, the waveguide guides the optical signal in way of vertically emitting an optical signal to the waveguide through an opto-electronic component. The path of the optical signal is changed by a 45-degrees incident face of the waveguide, and the optical signal is guided into the waveguide. Then, the optical signal is guided out from the waveguide by a 45-degrees outgoing face and received by the other opto-electronic component. However, such light guiding process needs to change the transmission path of the optical signal, which has a potential problem of the optical signal distortion due to energy loss and lack of alignment precision.

SUMMARY

An aspect of the present invention provides an opto-electronic circuit board. A waveguide layer is disposed in the opto-electronic circuit board, and a transmission of an optical signal is completed without changing a path of the optical signal. As a result, the optical signal energy loss is reduced, and a more accurate and effective signal transmission is achieved.

An aspect of the present invention provides an optical component including a base, a waveguide layer, an emitting portion, and a receiving portion. The base includes a first via, a second via, a first surface, and a second surface opposite the first surface, in which the first via and the second via respectively penetrate the base from the first surface to the second surface. The waveguide layer is disposed on the first surface, in which the waveguide layer includes a bottom cladding layer, a top cladding layer, and a core layer which is clad between the bottom cladding layer and the top cladding layer.

In one or more embodiments, the emitting portion is disposed at a side of the waveguide layer, in which the emitting portion includes a first inserting portion, a first light-guide hole, a first reflective layer, and a light emitter. The first inserting portion inserts into the first via. The first light-guide hole aligns the core layer of the waveguide layer. The first reflective layer is disposed on an inner surface of the first light-guide hole. The light emitter aligns the first light-guide hole, in which the light emitter provides an optical signal entering to the core layer through the first light-guide hole.

In one or more embodiments, the receiving portion is disposed at the other side of the waveguide layer, wherein the receiving portion includes a second inserting portion, a second light-guide hole, a second reflective layer, and a light receiver. The second inserting portion inserts into the second via. The second light-guide hole aligns the core layer of the waveguide layer. The second reflective layer is disposed on an inner surface of the second light-guide hole. The light receiver aligns the second light-guide hole, in which the optical signal passes through the core layer and enters the light receiver via the second light-guide hole.

In one or more embodiments, the emitting portion further includes a first conductive layer and a second conductive layer. The first conductive layer is disposed on a surface of the emitting portion and opposite the waveguide layer. The second conductive layer is disposed on a surface of the emitting portion with the same side of the second surface, wherein the first conductive layer is electrically connected to the second conductive layer.

In one or more embodiments, the receiving portion further includes a third conductive layer and a fourth conductive layer. The third conductive layer is disposed on a surface of the receiving portion and opposite the waveguide layer. The fourth conductive layer is disposed on a surface of the receiving portion with the same side of the second surface, wherein the third conductive layer is electrically connected to the fourth conductive layer.

In one or more embodiments, the optical component further includes condensers disposed at opposite sides of the waveguide layer, in which the centers of the condensers align the core layer.

In one or more embodiments, the core layer of the waveguide layer is located at a connecting line between the light emitter and the light receiver.

An aspect of the present invention provides an opto-electronic circuit board including a substrate, a cavity, blind vies, metal layers, a first chip, a second chip, and the optical component. The substrate includes a first circuit layer, a second circuit layer, and a dielectric layer disposed between the first circuit layer and the second circuit layer. The cavity is disposed on the dielectric layer, in which the cavity extends from the first circuit layer to the second circuit layer. The blind vias are disposed at opposite sides of the cavity. The metal layers are disposed in the blind vias for interconnecting the first circuit layer and the second circuit layer. The first chip is disposed on the second circuit layer with corresponding to one of the blind vias. The second chip is disposed on the second circuit layer with corresponding to the other one of the blind vias. The optical component is disposed in the cavity, in which the second surface of the optical component is connected to the first circuit layer.

In one or more embodiments, the emitting portion further includes a first conductive layer and a second conductive layer. The first conductive layer is disposed on a surface of the emitting portion and opposite the waveguide layer. The second conductive layer is disposed on a surface of the emitting portion with the same side of the second surface and connected to the first circuit layer, in which the first conductive layer is electrically connected to the second conductive layer and the second conductive layer is connected to the first circuit layer.

In one or more embodiments, the opto-electronic circuit board of claim further includes solder balls, in which the solder balls are disposed between the second conductive layer and the first circuit layer.

In one or more embodiments, the receiving portion further includes a third conductive layer and a fourth conductive layer. The third conductive layer is disposed on a surface of the receiving portion and opposite the waveguide layer. The fourth conductive layer is disposed on a surface of the receiving portion with the same side of the second surface and connected to the first circuit layer, in which the third conductive layer is electrically connected to the fourth conductive layer and the fourth conductive layer is connected to the first circuit layer.

In one or more embodiments, the opto-electronic circuit board further includes solder balls, in which the solder balls are disposed between the fourth conductive layer and the first circuit layer.

In one or more embodiments, the substrate is a multi-layer circuit board or a resin coated copper (RCC).

An aspect of the present invention provides a method of assembling an opto-electronic circuit board including the steps of (It should be understood that unless otherwise indicated, the sequence may be arranged as required. Even all or partial of the steps may be performed simultaneously.):

(1) forming vias at opposite sides of a base and forming a waveguide layer on a surface of the base and between the vias;

(2) forming at least one light-guide hole at base materials respectively and processing the base materials, such that the base materials can insert into the vias;

(3) disposing a light emitter and a light receiver on the base materials which have been processed with corresponding to the light-guide holes, in which the light emitter and the light receiver respectively insert into the vias.

(4) aligning the light emitter and the light receiver with a core layer of the waveguide layer through the light-guide holes such that an optical component is formed, in which the core layer is located at a connecting line between the light emitter and the light receiver;

(5) patterning a metal surface of a substrate and processing the substrate, such that a cavity and blind vias are formed, in which metal layers are coated on inner surfaces of the blind vias; and (6) disposing the optical component in the cavity and chips on the blind vias.

In one or more embodiments, the method further includes forming a reflective layer on an inner surface of each of the light-guide holes.

In one or more embodiments, the method further includes disposing condensers at opposite sides of the waveguide layer, wherein the centers of the condensers align the core layer.

The opto-electronic circuit board of the present invention is an embedded opto-electronic circuit board, and the substrate and the optical component of the opto-electronic circuit board are fabricated individually. Moreover, the waveguide layer, the emitting portion, and receiving portion of the optical component are also fabricated individually. With such method, the fabricating process is speeded up, and the fabrication yield rate of each of components can be controlled individually. Furthermore, the light path of the opto-electronic circuit board of the present invention needs not be changed, and the transmission can be achieved such that a potential problem of optical signal energy loss is reduced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

In a conventional opto-electronic circuit board, an optical signal is guided by a waveguide layer. However, when the waveguide layer is disposed in the opto-electronic circuit board, the optical signal vertically enters the waveguide layer, and the transmission direction of the optical signal is changed by a 45-degrees incident face of the waveguide layer such that the optical signal can enters a core layer of the waveguide layer. Then, the transmission direction of the optical signal is changed again by a 45-degrees outgoing face of the waveguide layer, such that the optical signal can enter into a light receiver. The energy of the optical signal energy is decayed due to changing the transmission direction of the optical signal twice, and an optical signal distortion is also a potential problem.

Therefore, an aspect of the present invention provides an opto-electronic circuit board that the optical signal can enters the waveguide layer without changing the transmission direction of the optical signal, such that the problem of the optical signal distortion is reduced. In addition, the opto-electronic circuit board of the present invention board is an embedded opto-electronic circuit board, and thus components of the opto-electronic circuit board are assembled in one after individually fabricating of each of the components. With such method, the fabricating process is speeded up, and the fabrication yield rate of each of components can be controlled individually.

Figure 1A:
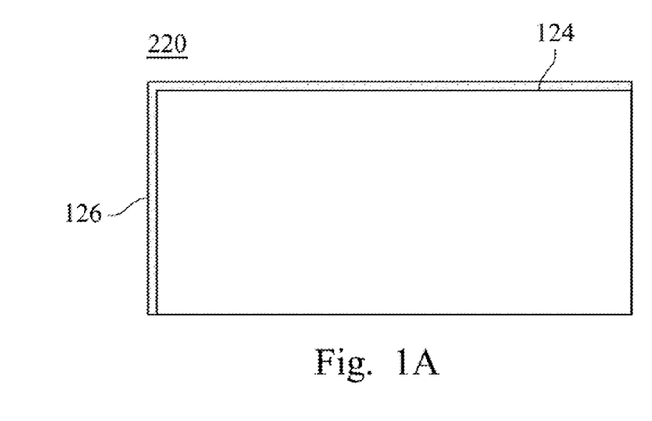
FIG. 1A to FIG. 1D are schematic drawings of processing a material base of an opto-electronic circuit board of the present invention in different steps.
Figure 1B:
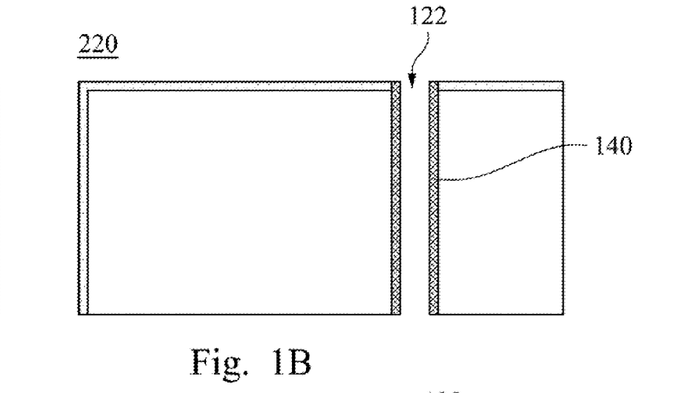
Figure 1C:
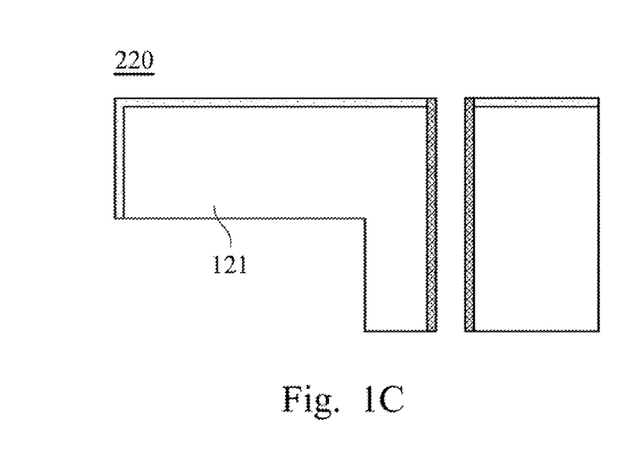
Figure 1D:
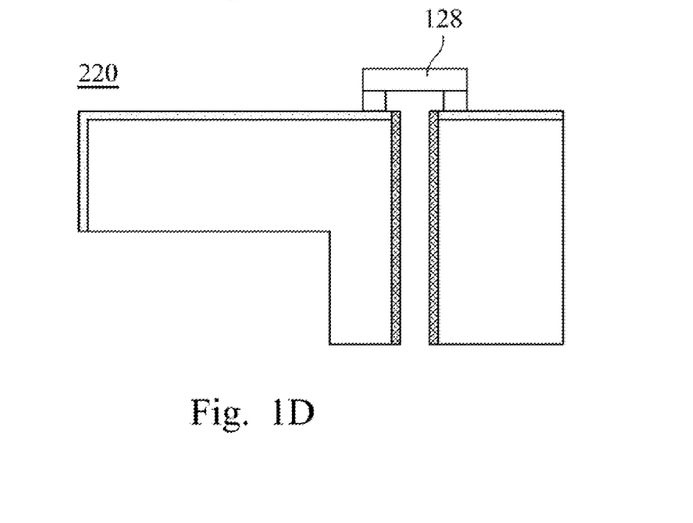

FIG. 1A to FIG. 1D are schematic drawings of processing a material base of an opto-electronic circuit board of the present invention in different steps. As shown in FIG. 1A, an emitting portion or a receiving portion is formed by processing a base material 220. The present embodiment is an example of a fabrication of forming the emitting portion. The base material 220 includes a first conductive layer 124 and a second conductive layer 126 disposed on a surface. After processing the base material 220, a first light-guide hole 122 penetrating the base material 220 is formed, and a first reflective layer 140 is formed in the first light-guide hole 122, as shown in FIG. 16. Then, the base material 220 is farmed to a specific shape, such that a first inserting portion 121 is formed, as shown in FIG. 1C. Finally, a light emitter 128 is disposed on the first conductive layer 124 corresponding to the first light-guide hole 122, as shown in FIG. 1D. Conversely, if the assembly is a fabrication of forming the receiving portion, the component disposed in FIG. 1D (the light emitter 128) is a light receiver.

In addition, in the fabrication of the base material 220, after forming the first light-guide hole 122, a person having ordinary skill in the art may choose a proper material of the first reflective layer 140 as required such that an effect of reducing energy loss during the transmission of the optical signal is achieved.

Figure 2A:
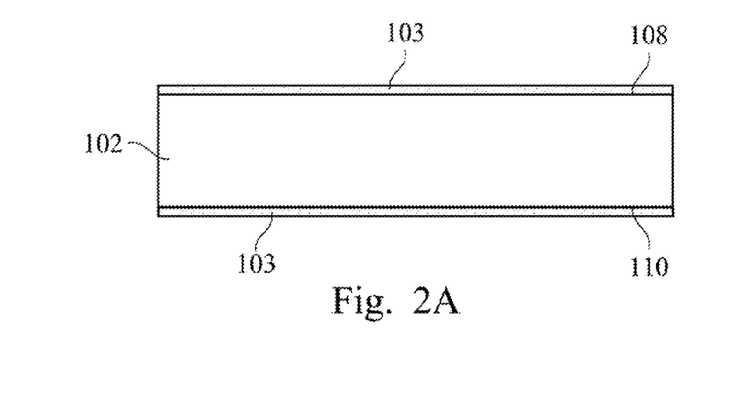
FIG. 2A and FIG. 2B are schematic drawings of processing a base of an opto-electronic circuit board of the present invention in different steps.
Figure 2B:
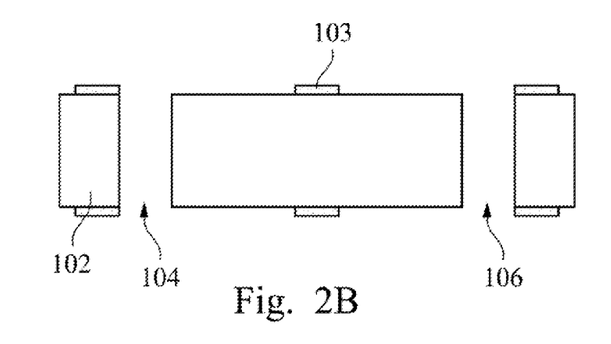

FIG. 2A and FIG. 2B are schematic drawings of processing a base of an opto-electronic circuit board of the present invention in different steps. According to FIG. 2A and FIG. 2B, a base 102 includes a first surface 108, a second surface 110, and a cover layer 103 covering the first surface 108 and the second surface 110, in which the cover layer 103 builds an inside electrical communication of an opto-electronic circuit board. The partial cover layer 103 is removed by lithography, and the base 102 is processed such that a first via 104 and a second via 106 are formed. The first via 104 and the second via 106 are respectively disposed at opposite sides of the base 102, and both the first via 104 and the second via 106 penetrate the base 102 from the first surface 108 to the second surface 110.

Figure 2C:
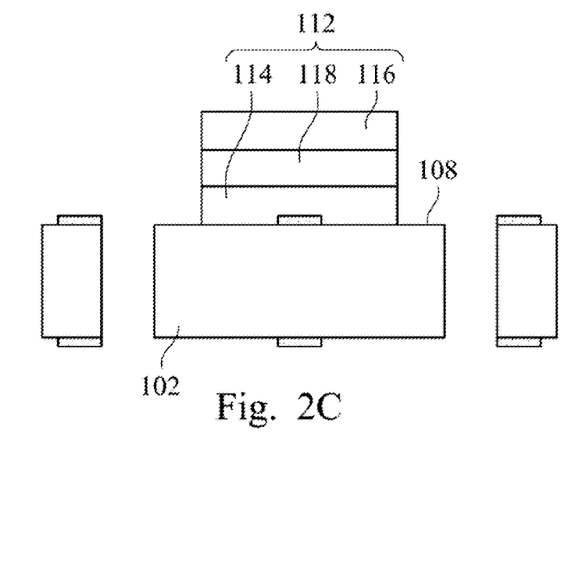
FIG. 2C is a side view of a waveguide layer formed on the base of FIG. 2B.

FIG. 2C is a side view of a waveguide layer formed on the base of FIG. 2B. A waveguide layer 112 is disposed on the first surface 108 of the base 102. The waveguide layer 112 is defined by orderly forming a bottom cladding layer 114, a core layer 118, and a top cladding layer 116 on the base 102, in which the bottom cladding layer 114, the core layer 118, and the top cladding layer 116 can formed by coating process, dry film process, lithography or combinations thereof.

Figure 3:
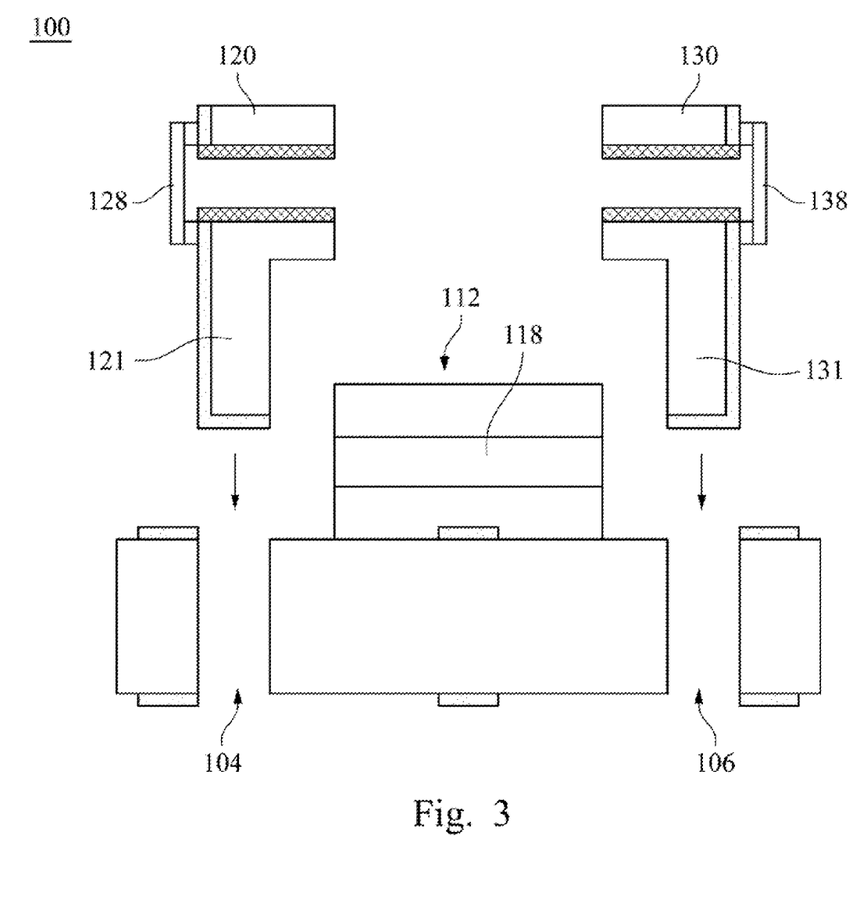
FIG. 3 is a schematic drawing of assembling an optical component according to a first embodiment of the present invention.

FIG. 3 is a schematic drawing of assembling an optical component according to a first embodiment of the present invention. A first inserting portion 121 of an emitting portion 120 aligns with and inserts into a first via 104 along a direction of an arrow. A second inserting portion 131 of a receiving portion 130 aligns with and inserts into a second via 106 along a direction of an arrow. After forming an optical component 100, a light emitter 128 and a light receiver 138 align with a core layer 118 of a waveguide layer 112, and the core layer 118 is located at a connecting line between the light emitter 128 and the light receiver 138.

Figure 4A:
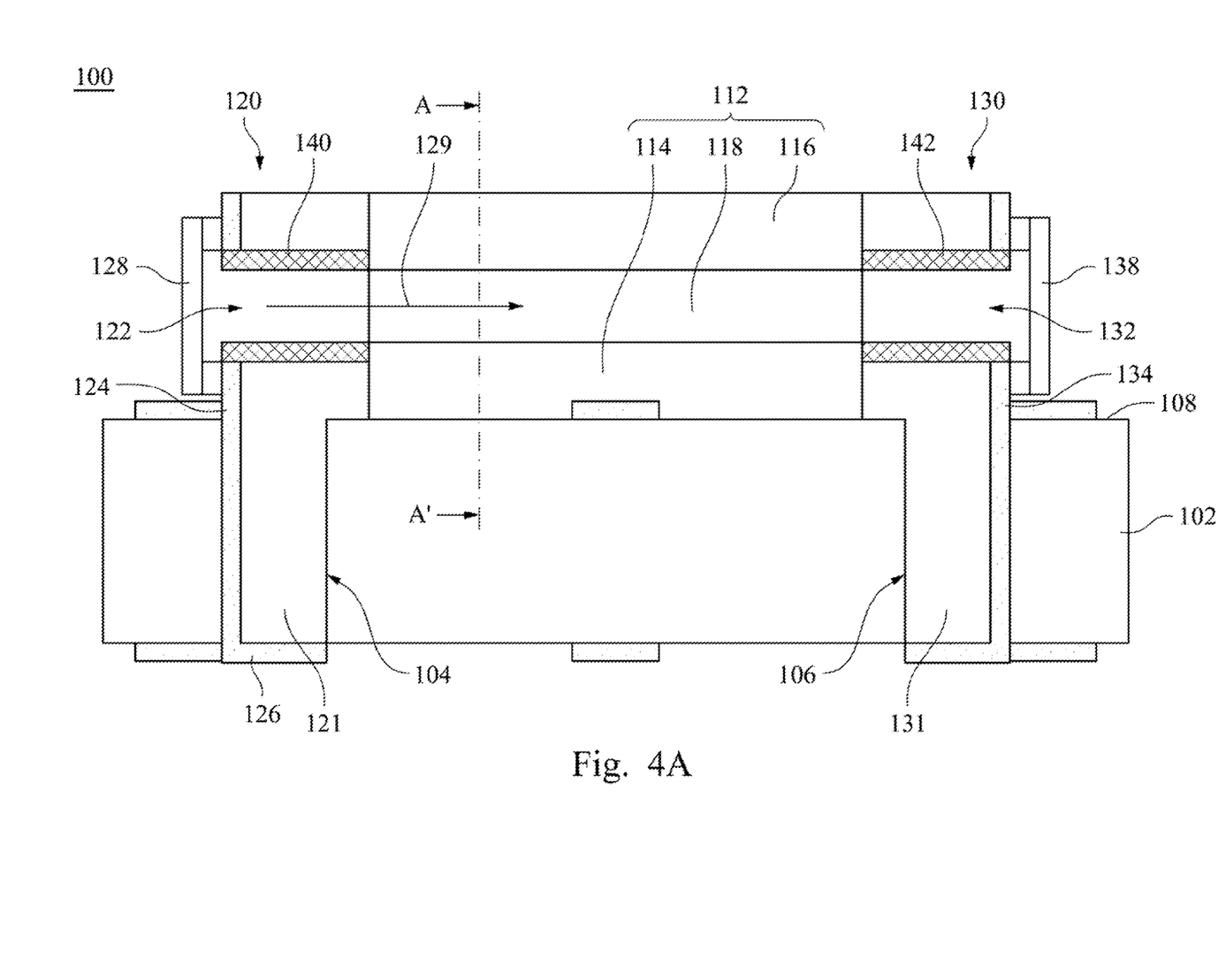
FIG. 4A is a side view of an optical component according to a first embodiment of the present invention.

FIG. 4A is a side view of an optical component according to a first embodiment of the present invention. An optical component 100 includes a base 102, a waveguide layer 112, an emitting porting 120, and a receiving portion 130.

According to an embodiment of the present invention, the refractive indexes of a bottom cladding layer 114 and a top cladding layer 116 are the same and less than the refractive index of a core layer 118. When a light transmits in the core layer 118 with such refractive index disposition, the total reflection is occurred at interfaces between the core layer 118 and the top cladding layer 116 and between the core layer 118 and the bottom cladding layer 114. With the total reflection, the energy loss due to outward transmitting of the light is prevented, and the light keeps transmitting in the core layer 118. In other words, the core layer 118 of the waveguide layer 118 can be regarded as a transmitting channel of the light.

In the present embodiment, a first reflective layer 140 is disposed on an inner surface of a first light-guide hole 122, and a second reflective layer 142 is disposed on an inner surface of a second light-guide hole 132. When an optical signal 129 passes through the first light-guide hole 122, the first reflective layer 140 can reduce the energy loss of the optical signal 129. Similarly, when the optical signal 129 passes through the second light-guide hole 132, the second reflective layer 142 also can reduce the energy loss of the optical signal 129.

The first reflective layer 140 and the second reflective layer 142 are made of gold, copper, nickel, silver, zinc, chromium, tin, aluminum or metal combinations thereof.

According to an embodiment of the present invention, because the light emitter 128 the light receiver 138, and the core layer 118 are located at the same connecting line and the energy loss of the e 129 is reduced by the disposition of the first reflective layer 140 and the second reflective layer 142, the optical component 100 has an effect of reducing the energy loss of the optical signal 129.

The core layer 118, the top cladding layer 116 and the bottom cladding layer 114 are made of resin, polymethylmethacrylate (PMMA), polyimide (PI) or combinations thereof.

The emitting portion 120 is disposed at a side near the waveguide layer 112, and the emitting portion 120 is fixed with its first inserting portion 121 inserting into the first via 104. In other words, the emitting portion 120 and a base 102 are not formed in one-piece. Thus, the emitting portion 120 is combined with the base 102 after the individual fabrication of the emitting portion 120. The emitting portion 120 includes the first light-guide hole 122, a first conductive layer 124, a second conductive layer 126, and the light emitter 128.

After the emitting portion 120 inserts into the first via 104, the first light-guide hole 122 aligns with the core layer 118 of the waveguide layer 112. The first conductive layer 124 is disposed opposite the waveguide layer 112 and on a surface of the emitting portion 120. The second conductive layer 126 is disposed at the same side of the second surface 110 and on a surface of the emitting portion 120. The surfaces covered with the first conductive layer 124 and the second conductive 126 are adjacent, and therefore the first conductive layer 124 is electrically connected to the second conductive layer 126.

The light emitter 128 is disposed on the first conductive layer 124, and the light emitter 128 is used for converting an inputting electrical signal into an optical signal and outputting the optical signal. In an embodiment of the present invention, the light emitter 128 provides the optical signal 129 with aligning the first light-guide hole 122, and the first light-guide hole 122 aligns with the core layer 118 such that the optical signal 129 enters the core layer 118 through the first light-guide hole 122.

The receiving portion 130 is disposed at the other side near the waveguide layer 112, and the receiving portion 130 is fixed with its second inserting portion 131 inserting into the second via 106. In other words, the receiving portion 130 and the base 102 are not formed in one-piece. Thus, the receiving portion 130 is combined with the base 102 after the individual fabrication of the receiving portion 130. The receiving portion 130 includes a corresponding structure with the emitting portion 120.

The light receiver 138 is disposed on a third conductive layer 134, and the light emitter 128 is used for converting an inputting optical signal into an electrical signal and outputting the electrical signal. In an embodiment of the present invention, the light receiver 138 aligns with a second light-guide hole 122 for receiving the optical signal 129, and the second light-guide hole 132 aligns with the core layer 118 such that the optical signal 129 enters the light receiver 138 through the second light-guide hole 132. In other words, the optical signal 129 passes through the core layer 118 and enters the light receiver 138 via the second light-guide hole 132.

When the light emitter 128 receives the electrical signal, the light emitter 128 provides the optical signal 129. The optical signal 129 travels from the first light-guide hole 122 through the core layer 118 and the second light-guide hole 132, and reaches the light receiver 138. After the light receiver 138 receives the optical signal 129, the light receiver 138 converts the optical signal 129 into an electrical signal and outputs the electrical signal.

Figure 4B:
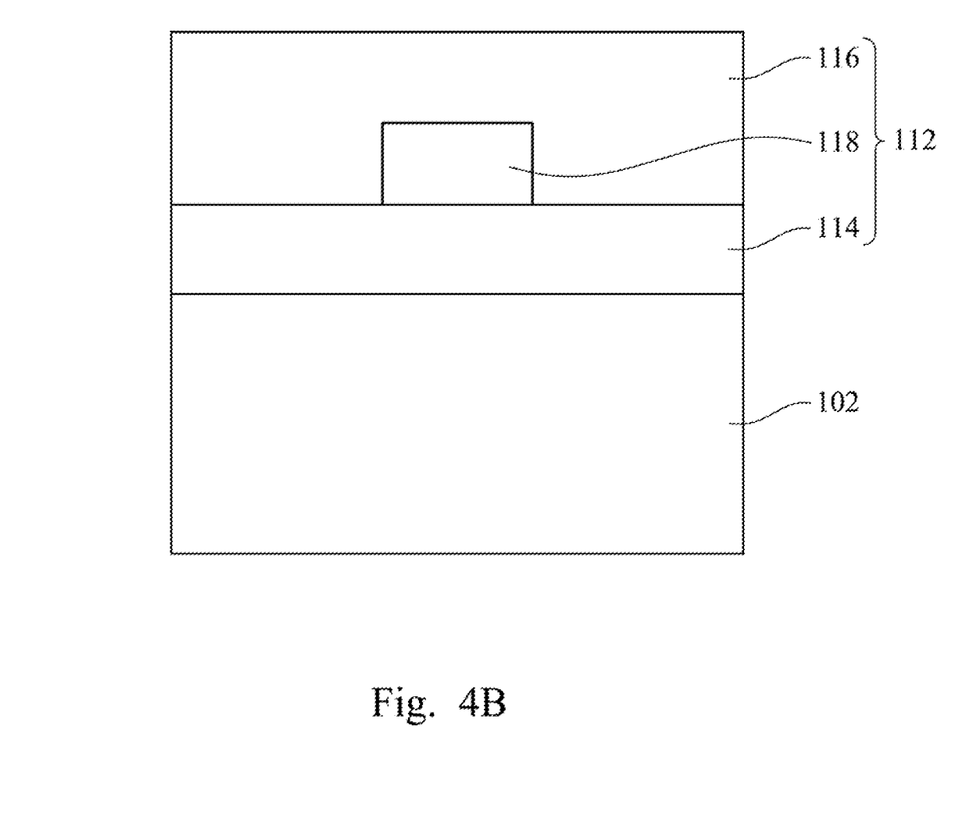
FIG. 4B is a cross-sectional view in FIG. 4B taken along line AA'.

FIG. 4B is a cross-sectional view in FIG. 4B taken along line AA'. According to FIG. 4A and FIG. 4B the core layer 118 along the horizontal direction (the transmitting direction of the optical signal 129) is about a pillar shape, in which the core layer 118 with the pillar shape is located at the connecting line between the light emitter 128 and the light receiver 138. In other words, the core layer 118, the light emitter 128, and the light receiver 138 are located on the same plane, in which the plane is parallel with a first surface 108.

In addition, for making the description succinct, only one core layer 118, one light emitter 128, and one light receiver 138 of the optical component 100 are illustrated in FIG. 4A. However, a person having ordinary skill in the art may choose the proper number of the core layer 118, the light emitter 128, and the light receiver 138 as required.

In the following embodiment, the descriptions are made to discuss the variations of the method of guiding the optical signal with the foundation of the first embodiment, and hence the same components of the first embodiment are not described again.

Figure 5:
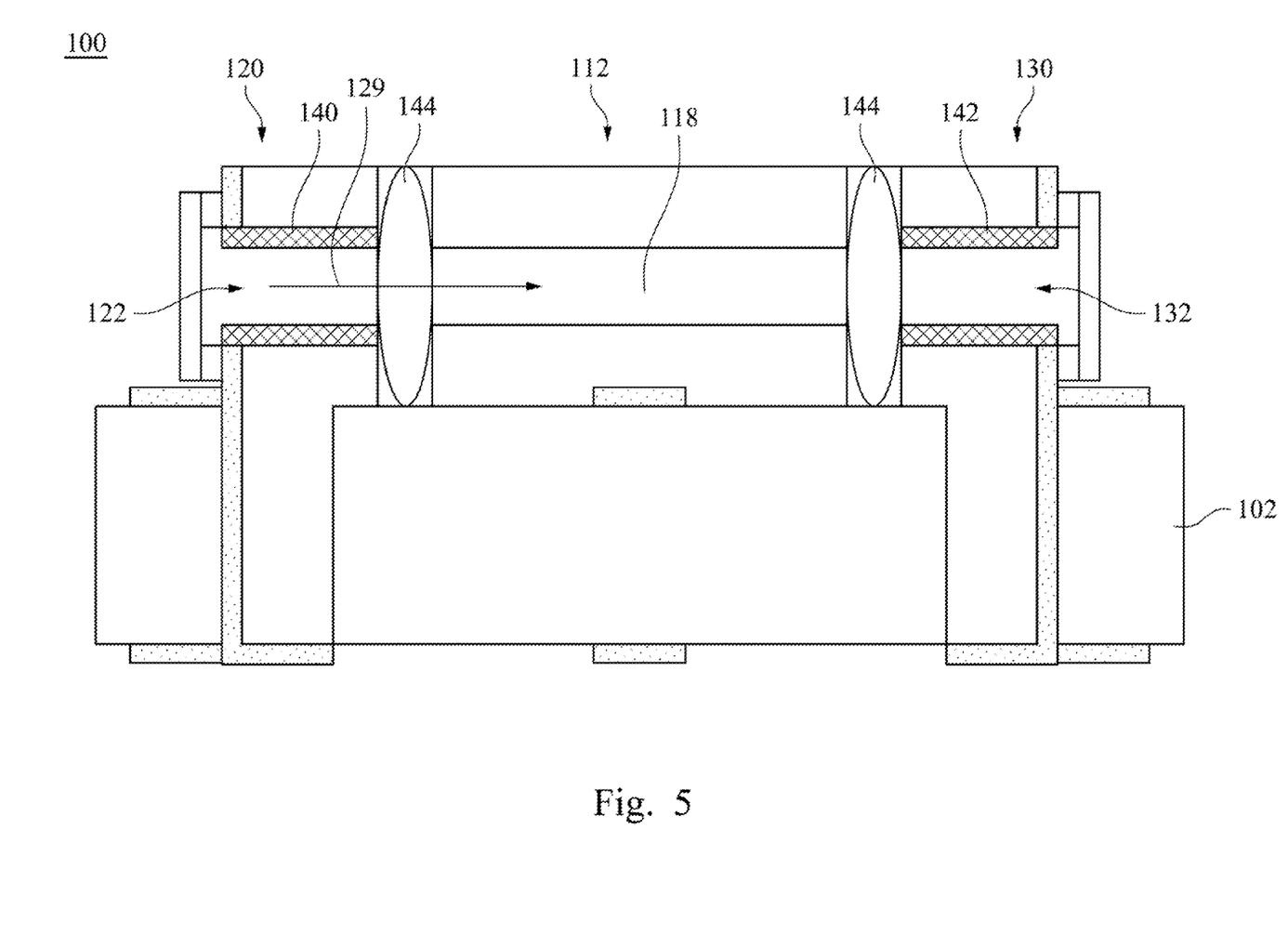
FIG. 5 is a side view of an optical component according to a second embodiment of the present invention.

FIG. 5 is a side view of an optical component according to a second embodiment of the present invention. An optical component 100 includes a base 102, a waveguide layer 112, an emitting porting 120, a receiving portion 130, and condensers 144. The waveguide layer 112 is disposed on the base 102, and the emitting porting 120 and the receiving portion 130 are respectively disposed on opposite sides of the waveguide layer 112.

The emitting portion 120 includes a first light-guide hole 122, and a first reflective layer 140 is disposed on an inner surface of the first light-guide hole 122. The receiving portion 130 includes a second light-guide hole 132, and a second reflective layer 142 is disposed on an inner surface of the second light-guide hole 132.

In the present embodiment, the condensers 144 make an optical signal 129 have a better property of being aligned to core layer 118, and the first reflective layer 140 and the second reflective layer 142 can reduce the energy loss of the optical signal 129 during the transmission. When the condensers 144, the first reflective layer 140, and the second reflective layer 142 are disposed at the same time, the energy loss of optical signal 129 of the optical component 100 of the present invention can be reduced and the optical signal 129 has the better property of alignment.

Figure 6:
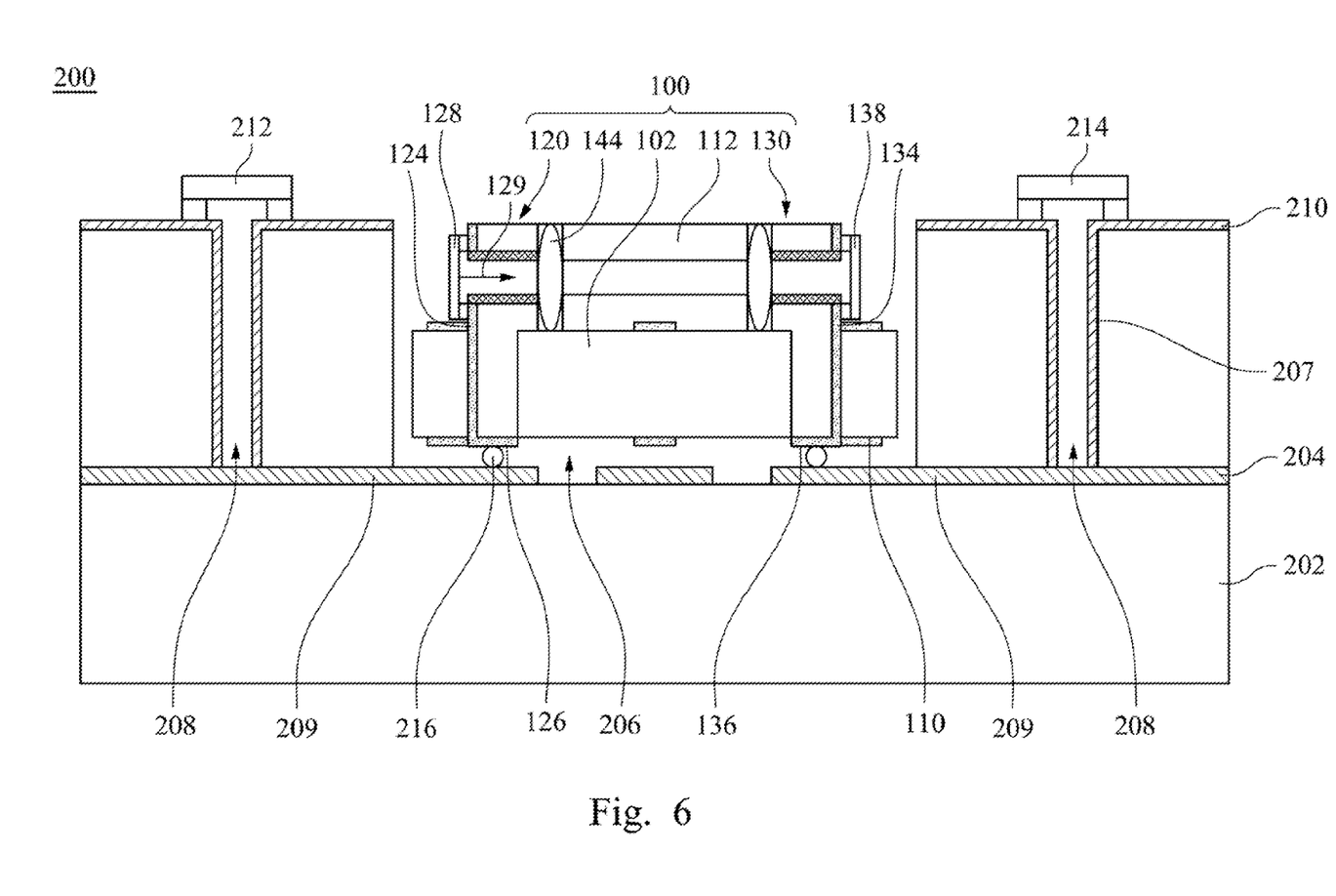
FIG. 6 is a side view of an opto-electronic circuit board according to an embodiment of the present invention.

FIG. 6 is a side view of an opto-electronic circuit board according to an embodiment of the present invention. An opto-electronic circuit board 200 includes an optical component 100 and a substrate 202. The optical component 100 is disposed in a cavity 206 of the substrate 202. The optical component 100 in FIG. 6 is the optical component 100 of the second embodiment. However, a person having ordinary skill in the art may choose a proper type of the optical component 100, the first embodiment or the second embodiment, in the cavity 206 as required.

A second surface 110 of a base 102, a second conductive layer 126 of an emitting portion 126, and a fourth conductive layer 136 of a receiving portion 130 are the same plane, and such plane is a bottom plane of the optical component 100. The bottom plane of the optical component 100 is connected to a first circuit layer 204 exposed by the cavity 206 through solder balls 216. In other words, the second surface 110, the second conductive layer 126, and the fourth conductive layer 136 are connected to the first circuit layer 204. The solder balls 216 are respectively disposed between the second conductive layer 126, the fourth conductive layer 136, and the first circuit layer 204.

The solder balls 216 are mainly used for keeping the electrical connection, such that an electrical signal can enter the substrate 202 from the optical component 100 (or from the optical component 100 to the substrate 202). In addition, the solder balls 216 also have an effect of enhancing the fixing strength between the optical component 100 and the substrate 202.

However, a person having ordinary skill in the art may choose a proper location of the solder balls 216 as required.

With the above disposition, the second conductive layer 126 and the first circuit layer 204 are electrically connected. Therefore, a electrical connection set of a light emitter 128, a first conductive layer 124, the second conductive layer 126, the first circuit layer 204, a metal layer 207, and a second circuit layer 210 is formed. In addition, the fourth conductive layer 136 and the first circuit layer 204 are electrically connected, and therefore the other electrical connection set of a light receiver 138, a third conductive layer 134, the fourth conductive layer 138, the first circuit layer 204, a metal layer 207, and the second circuit layer 210 is formed.

The first circuit layer 204 includes discontinuous electrical connection pads 209, such that the electrical connection set including the light emitter 128 and the other electrical connection set including the light receiver 138 are electrically insulating.

The opto-electronic circuit board 200 includes a first chip 212 and a second chip 214, and the first chip 212 and the second chip 214 are respectively disposed on the second circuit 210. The first chip 212 and the light emitter 128 are in the same electrical connection set, and the second chip 214 and the light receiver 138 are in the same of the other electrical connection set.

According to an embodiment of the present invention, the first chip 212 sends an electrical signal to the light emitter 128 through the electrical connection set including the first chip 212. When the light emitter 128 receives the electrical signal, the light emitter 128 provides an optical signal 129. The optical signal 129 is guided by a waveguide layer 112 and received by the light receiver 138. The light receiver 138 converts the optical signal 129 into an electrical signal and outputs the electrical signal, and the electrical signal is received by the second chip 214 through the electrical connection including the light receiver 138. Through the above path, the first chip 212 can complete the transmission of a signal with the second chip 214.

Figure 7A:
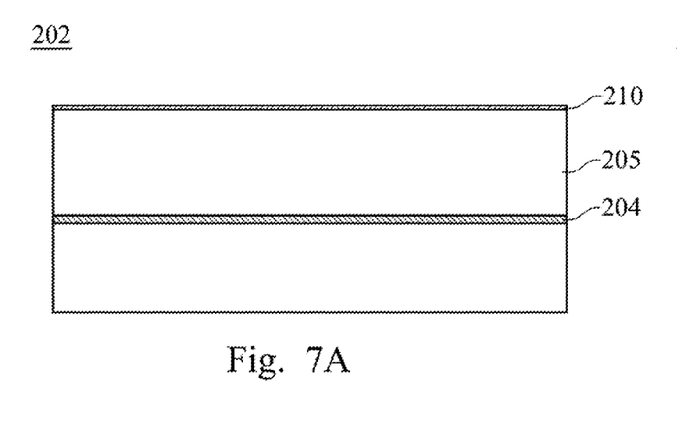
FIG. 7A to FIG. 7D are schematic drawings of processing a substrate of an opto-electronic circuit board of the present invention in different steps.
Figure 7B:
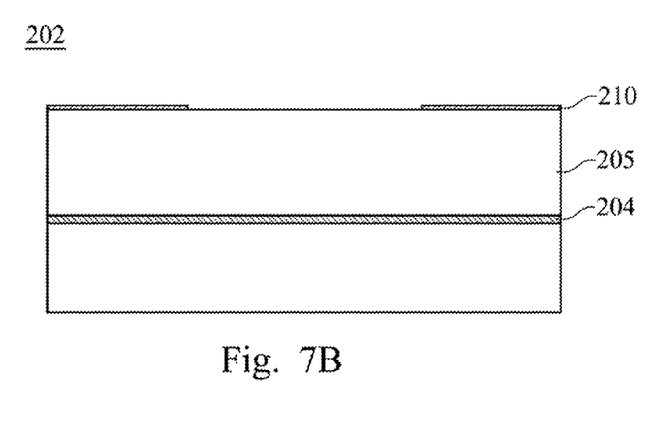
Figure 7C:
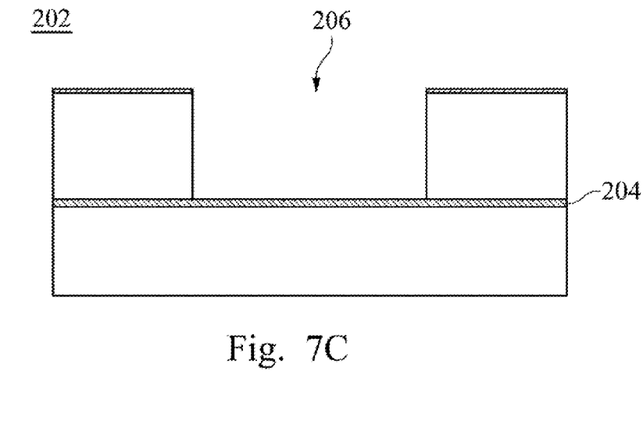
Figure 7D:
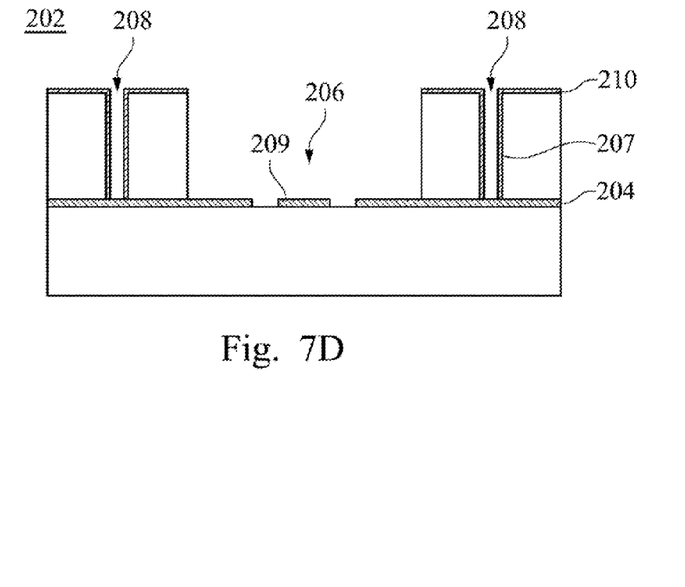

FIG. 7A to FIG. 7D are schematic drawings of processing a substrate of an opto-electronic circuit board of the present invention in different steps. As shown in FIG. 7A, a substrate 202 includes a first circuit layer 204, a second circuit layer 210, and a dielectric layer 205 between the first circuit layer 204 and the second circuit layer 210. The second circuit layer 210 is patterned, such that parts of a surface of the dielectric layer 205 are exposed, as shown in FIG. 7B. Then, a cavity 206 is formed in the dielectric layer 205 not covered with the second circuit layer 210, in which the cavity 206 extends from the first circuit layer 204 to the second circuit layer 210, as shown in FIG. 7C. Finally, blind vias 208 are formed at opposite sides of the cavity 206 by drilling or laser (not limited by these). Metal layers 207 are formed on inner surfaces of the blind vias 208 for electrically connecting to the first circuit layer 204 and the second circuit layer 210. Electrical connection pads 209 are formed by patterning the first circuit layer 204, as shown in FIG. 7D.

Figure 8:
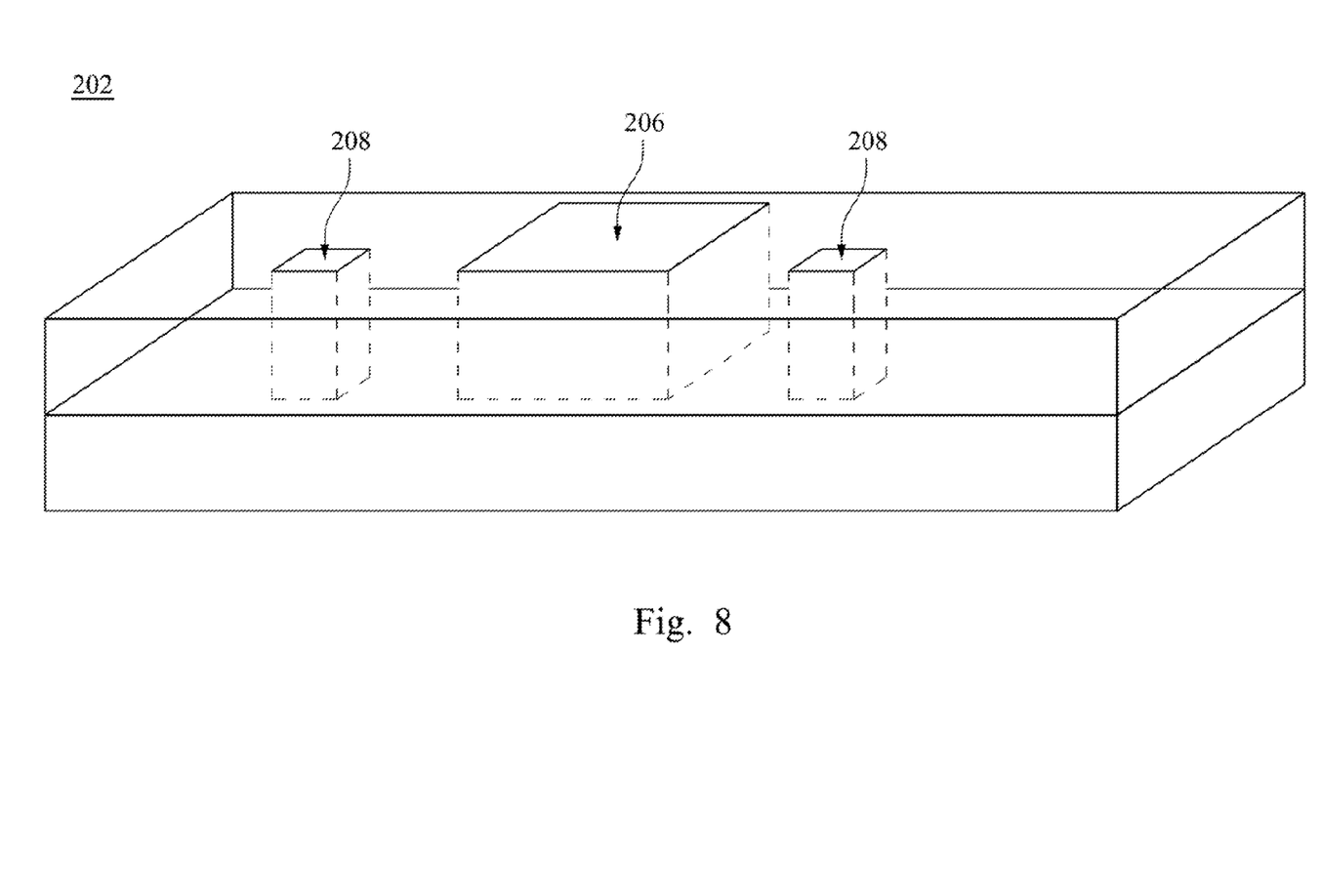
FIG. 8 is a stereoscopic perspective drawing of a substrate of an opto-electronic circuit board according to an embodiment of the present invention.

FIG. 8 is a stereoscopic perspective drawing of a substrate of an opto-electronic circuit board according to an embodiment of the present invention. According to FIG. 7D and FIG. 8, the substrate 202 includes the cavity 206, in which the size of the cavity 206 corresponds to the optical component (as shown in FIG. 1A). Because the opto-electronic circuit board of the present invention is an embedded opto-electronic circuit board, the size including depth, length, width of the cavity 206 is mainly designed for letting the optical component can put in.

Similarly, the blind vias 208 mainly provide spaces for disposing the metal layers 207, and therefore the blind vias 208 mainly provide the first circuit layer 204 and the second circuit layer 210 with electrical connection through the metal layer 207.

In other words, sizes of the cavity 206 and blind vies 208 are not limits of the present invention. A person having ordinary skill in the art may choose proper sizes of the cavity 206 and blind vias 208.

The opto-electronic circuit board of the present invention is formed through combining the optical component and the substrate. In the following embodiments, the descriptions are made to discuss a combination method of the optical component and the substrate, and the same disposition of the components are not stated again.

Referring to FIG. 6 and FIG. 8, the first chip 212 and the second chip 214 are respectively disposed on the blind vias 208, and the optical component 100 is disposed in the cavity 206. Therefore a person having ordinary skill in the art may choose proper locations of the cavity 206 and blind vias 208 according to the circuit layout as required.

Figure 9:
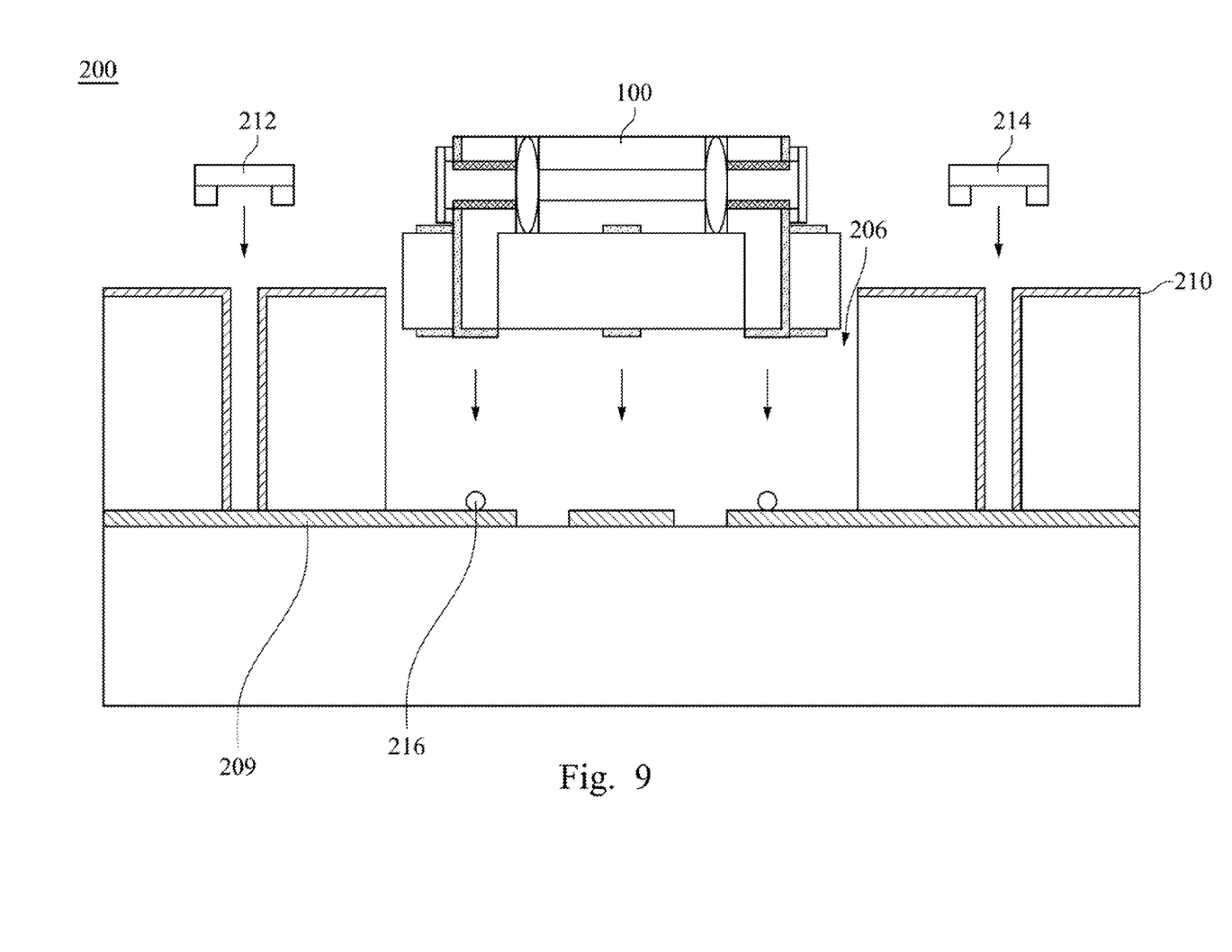
FIG. 9 is a schematic drawing of assembling the opto-electronic circuit board in FIG. 6.

FIG. 9 is a schematic drawing of assembling the opto-electronic circuit board in FIG. 6. After disposing the solder balls 216 on the electrical connection pads 209 on the bottom of the cavity 206, the optical component 100 is disposed into the cavity 206. Then, the first chip 212 and the second chip 214 are respectively disposed on the second circuit layer 210. For example, the first chip 212 is a sending-signal chip, and the second chip 214 is a receiving-signal chip. However, a person having ordinary skill in the art may choose proper types of the first chip 212 and the second chip 214 as required.

Similarly, a person having ordinary skill in the art may choose a proper type of the optical component, the first embodiment or the second embodiment, as required.

Figure 10:
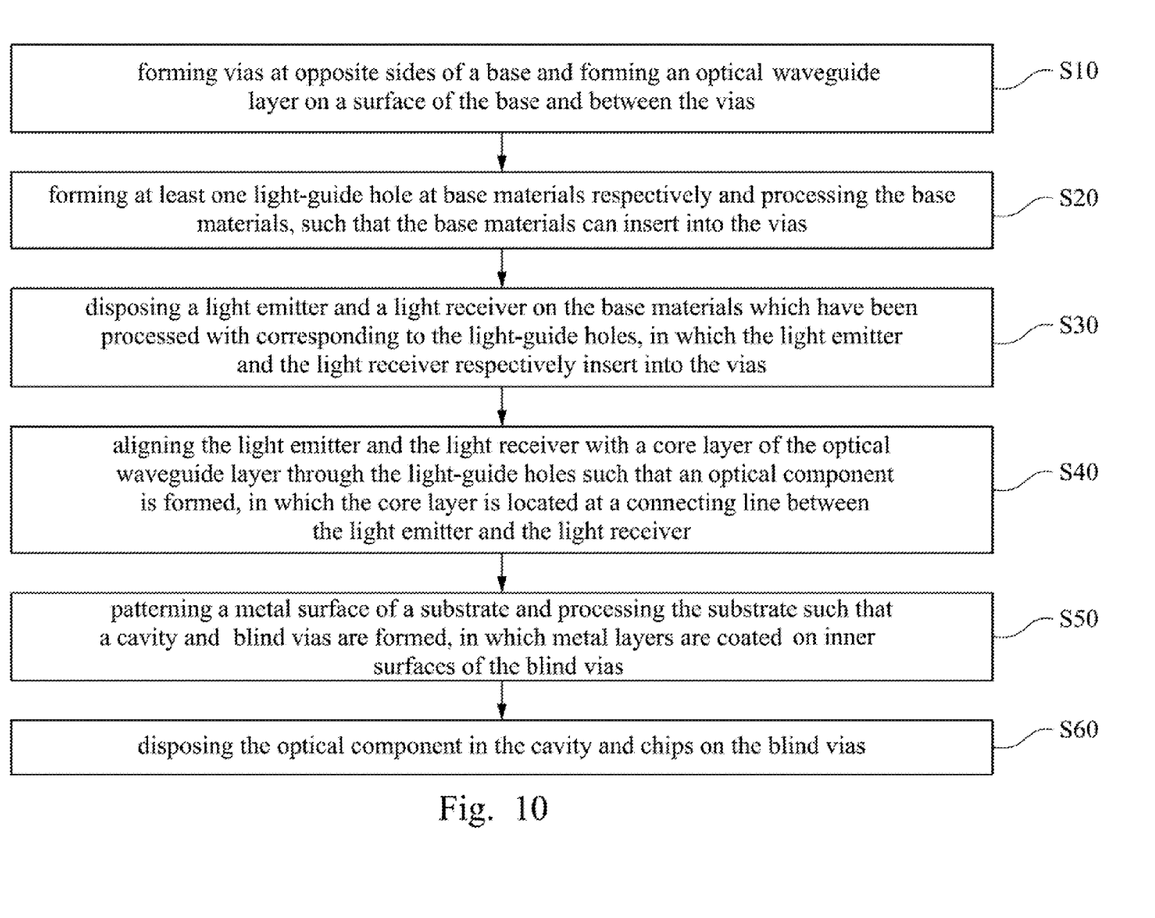
FIG. 10 is a flow chart of a method for assembling an opto-electronic circuit board of an embodiment of the present invention.

FIG. 10 is a flow chart of a method for assembling an opto-electronic circuit board of an embodiment of the present invention. A method of assembling an opto-electronic circuit board of the present invention includes a number of steps as described below. Step S10 is forming vias at opposite sides of a base and forming a waveguide layer on a surface of the base and between the vias. Step S20 is forming at least one light-guide hole at base materials respectively and processing the base materials, such that the base materials can insert into the vias. Step S30 is disposing a light emitter and a light receiver on the base materials which have been processed with corresponding to the light-guide holes, in which the light emitter and the light receiver respectively insert into the vies. Step S40 is aligning the light emitter and the light receiver with a core layer of the waveguide layer through the light-guide holes such that an optical component is formed, in which the core layer is located at a connecting line between the light emitter and the light receiver. Step S50 is patterning a metal surface of a substrate and processing the substrate such that a cavity and blind vias are formed, in which metal layers are coated on inner surfaces of the blind vias. Step S60 is disposing the optical component in the cavity and chips on the blind vias.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An optical component, comprising:
 a base comprising a first via, a second via, a first surface, and a second surface opposite the first surface, wherein the first via and the second via respectively penetrate the base from the first surface to the second surface;
 a waveguide layer disposed on the first surface and comprising a bottom cladding layer, a top cladding layer, and a core layer which is clad between the bottom cladding layer and the top cladding layer;
 an emitting portion disposed at a side of the waveguide layer;
 the emitting portion comprising:
  a first inserting portion inserting into the first via;
  a first light-guide hole aligning with the core layer of the waveguide layer, wherein the first inserting portion and the first light-guide hole are one integral unit;
  a first reflective layer disposed on an inner surface of the first light-guide hole; and
  a light emitter aligning with the first light-guide hole and providing an optical signal entering to the core layer through the first light-guide hole; and
 a receiving portion disposed at the other side of the waveguide layer the receiving portion comprising:
  a second inserting portion inserting into the second via;
  a second light-guide hole aligning with the core layer of the waveguide layer, wherein the second inserting portion and the second light-guide hole are one integral unit;
  a second reflective layer disposed on an inner surface of the second light-guide hole; and
  a light receiver aligning with the second light-guide hole, wherein the optical signal passes through the core layer and enters the light receiver via the second light-guide hole.

2. The optical component of claim 1, wherein the emitting portion further comprises:
 a first conductive layer disposed on a surface of the emitting portion and opposite the waveguide layer; and
 a second conductive layer disposed on a surface of the emitting portion with the same side of the second surface, wherein the first conductive layer is electrically connected to the second conductive layer.

3. The optical component of claim 1, wherein the receiving portion further comprises:
   a third conductive layer disposed on a surface of the receiving portion and opposite the waveguide layer; and
   a fourth conductive layer disposed on a surface of the receiving portion with the same side of the second surface, wherein the third conductive layer is electrically connected to the fourth conductive layer.

4. The optical component of claim 1, further comprising a plurality of condensers disposed at opposite sides of the waveguide layer, wherein the centers of the condensers align with the core layer.

5. The optical component of claim 1, wherein the core layer of the waveguide layer is located at a connecting line between the light emitter and the light receiver.

6. An opto-electronic circuit board, comprising:
   a substrate comprising a first circuit layer, a second circuit layer, and a dielectric layer disposed between the first circuit layer and the second circuit layer;
   a cavity disposed on the dielectric layer, wherein the cavity extends from the first circuit layer to the second circuit layer;
   a plurality of blind vias disposed at opposite sides of the cavity;
   a plurality of metal layers disposed in the blind vias to interconnect the first circuit layer and the second circuit layer;
   a first chip disposed on the second circuit layer with corresponding to one of the blind vias;
   a second chip disposed on the second circuit layer with corresponding to the other one of the blind vias; and
   an optical component disposed in the cavity, wherein the optical component comprises:
      a base comprising a first via, a second via, a first surface, and a second surface opposite the first surface, wherein the first via and the second via respectively penetrate the base from the first surface to the second surface, and the second surface of the optical component is connected to the first circuit layer;
      a waveguide layer disposed on the first surface and comprising a bottom cladding layer, a top cladding layer, and a core layer which is clad between the bottom cladding layer and the top cladding layer;
      an emitting portion disposed at a side of the waveguide layer, the emitting portion comprising:
         a first inserting portion inserting into the first via;
         a first light-guide hole aligning with the core layer of the waveguide layer, wherein the first inserting portion and the first light-guide hole are one integral unit:
            a first reflective layer disposed on an inner surface of the first light-guide hole; and
            a light emitter aligning with the first light-guide hole and providing an optical signal entering to the core layer through the first light-guide hole; and
      a receiving portion disposed at the other side of the waveguide layer, the receiving portion comprising:
         a second inserting portion inserting into the second via;
         a second light-guide hole aligning with the core layer of the waveguide layer, wherein the second inserting portion and the second light-guide hole are one integral unit;
         a second reflective layer disposed on an inner surface of the second light-guide hole; and
         a light receiver aligning with the second light-guide hole, wherein the optical signal passes through the core layer and enters the light receiver via the second light-guide hole.

7. The opto-electronic circuit board of claim 6, wherein the emitting portion further comprises:
   a first conductive layer disposed on a surface of the emitting portion and opposite the waveguide layer; and
   a second conductive layer disposed on a surface of the emitting portion with the same side of the second surface and connected to the first circuit layer, wherein the first conductive layer is electrically connected to the second conductive layer and the second conductive layer is connected to the first circuit layer.

8. The opto-electronic circuit board of claim 7, further comprising a plurality of solder balls, wherein the solder balls are disposed between the second conductive layer and the first circuit layer.

9. The opto-electronic circuit board of claim 6, wherein the receiving portion further comprises:
   a third conductive layer disposed on a surface of the receiving portion and opposite the waveguide layer; and
   a fourth conductive layer disposed on a surface of the receiving portion with the same side of the second surface and connected to the first circuit layer, wherein the third conductive layer is electrically connected to the fourth conductive layer and the fourth conductive layer is connected to the first circuit layer.

10. The opto-electronic circuit board of claim 9, further comprising a plurality of solder balls, wherein the solder balls are disposed between the fourth conductive layer and the first circuit layer.

11. The opto-electronic circuit board of claim 6, wherein the substrate is a mufti-layer circuit board or a resin coated copper (RCC).

12. A method of assembling an opto-electronic circuit board, comprising:
   forming a plurality of vias at opposite sides of a base and forming a waveguide layer on a surface of the base and between the vias;
   forming at least one light-guide hole at a plurality of base materials respectively, wherein the plurality of base materials each include an inserting portion that is one integral unit of the at least one light-guide hole and the base material;
   processing the base materials, such that the inserting portions of the base materials insert into the vias;
   disposing a light emitter and a light receiver on the base materials which have been processed with corresponding to the light-guide holes, wherein the light emitter and the light receiver respectively insert into the vias;
   aligning the light emitter and the light receiver with a core layer of the waveguide layer through the light-guide holes such that an optical component is formed, wherein the core layer is located at a connecting line between the light emitter and the light receiver;
   patterning a metal surface of a substrate and processing the substrate, such that a cavity and a plurality of blind vias are formed, wherein a plurality of metal layers are coated on inner surfaces of the blind vias; and
   disposing the optical component in the cavity and a plurality of chips on the blind vias.

13. The method of claim 12, further comprising:
   forming a reflective layer on an inner surface of each of the light-guide holes.

14. The method of claim 12, further comprising:
   disposing a plurality of condensers at opposite sides of the waveguide layer, wherein the centers of the condensers align with the core layer.

* * * * *